US011637044B2

(12) United States Patent
Tang et al.

(10) Patent No.: US 11,637,044 B2
(45) Date of Patent: Apr. 25, 2023

(54) MICRO LED DISPLAY AND REPAIR METHOD THEREOF

(71) Applicant: PlayNitride Display Co., Ltd., MiaoLi County (TW)

(72) Inventors: Hsiang-Wen Tang, MiaoLi County (TW); Yu-Hung Lai, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 196 days.

(21) Appl. No.: 17/134,128

(22) Filed: Dec. 24, 2020

(65) Prior Publication Data

US 2022/0149110 A1    May 12, 2022

(30) Foreign Application Priority Data

Nov. 12, 2020 (TW) .................................. 109139461

(51) Int. Cl.
*H01L 21/66* (2006.01)
*H01L 27/15* (2006.01)
(Continued)

(52) U.S. Cl.
CPC .......... *H01L 22/30* (2013.01); *G01R 31/2635* (2013.01); *G09G 3/006* (2013.01);
(Continued)

(58) Field of Classification Search
CPC ....... H01L 22/30; H01L 27/156; H01L 33/62; G01R 31/2635; G09G 3/006
See application file for complete search history.

(56) References Cited

U.S. PATENT DOCUMENTS

| 8,791,474 | B1 | 7/2014 | Bibl et al. |
| 2006/0054919 | A1* | 3/2006 | Matsuda ............... H01L 33/405 |
| | | | 257/E33.068 |

(Continued)

FOREIGN PATENT DOCUMENTS

| CN | 105023522 | 11/2015 |
| CN | 107507906 | 12/2017 |

(Continued)

OTHER PUBLICATIONS

"Office Action of China Counterpart Application", dated May 19, 2022, p. 1-p. 7.

(Continued)

*Primary Examiner* — Feifei Yeung Lopez
(74) *Attorney, Agent, or Firm* — JCIPRNET

(57) ABSTRACT

A micro LED display includes a display substrate, a first soldering layer, at least one second soldering layer, first micro LEDs and at least one second micro LED. The display substrate includes a substrate having a plurality of pixel areas, a first circuit layer and a second circuit layer, and the first circuit layer and the second circuit layer are arranged in each pixel area. The first soldering layer is disposed on the first circuit layer, and the second soldering layer is disposed on the second micro LED. An arranging area of the first soldering layer is greater than an arranging area of the second soldering layer. The first micro LEDs is bonding to the first circuit layer in each pixel area through the first soldering layer. The second micro LED is bonding to the second circuit layer of one of the pixel areas through the second soldering layer.

16 Claims, 11 Drawing Sheets

(51) Int. Cl.
    *H01L 33/48*     (2010.01)
    *H01L 33/38*     (2010.01)
    *G09G 3/00*     (2006.01)
    *H01L 33/62*     (2010.01)
    *G01R 31/26*     (2020.01)

(52) U.S. Cl.
    CPC .......... *H01L 27/156* (2013.01); *H01L 33/382* (2013.01); *H01L 33/486* (2013.01); *H01L 33/62* (2013.01)

(56) References Cited

U.S. PATENT DOCUMENTS

| | | | | |
|---|---|---|---|---|
| 2011/0304058 | A1* | 12/2011 | Pendse | H05K 3/3452 |
| | | | | 438/126 |
| 2012/0086116 | A1* | 4/2012 | Taguchi | H01L 24/81 |
| | | | | 257/774 |
| 2017/0025075 | A1 | 1/2017 | Cok et al. | |
| 2020/0052033 | A1 | 2/2020 | Iguchi | |
| 2020/0152827 | A1* | 5/2020 | Chen | H01L 22/24 |
| 2021/0110748 | A1* | 4/2021 | Kim | H01L 33/62 |

FOREIGN PATENT DOCUMENTS

| | | |
|---|---|---|
| CN | 108257516 | 7/2018 |
| CN | 108288661 | 7/2018 |
| CN | 109148506 | 1/2019 |
| CN | 109216516 | 1/2019 |
| CN | 109257872 | 1/2019 |
| CN | 109728022 | 5/2019 |
| CN | 109891608 | 6/2019 |
| CN | 111192943 | 5/2020 |
| KR | 101890934 | 8/2018 |
| TW | 201445730 | 12/2014 |
| TW | 201826518 | 7/2018 |

OTHER PUBLICATIONS

"Notice of allowance of China Counterpart Application", dated Jul. 27, 2022, p. 1-p. 4.

"Office Action of Taiwan Counterpart Application", dated Aug. 16, 2021, p. 1-p. 3.

* cited by examiner

MICRO LED DISPLAY AND REPAIR METHOD THEREOF

CROSS-REFERENCE TO RELATED APPLICATION

This application claims the priority benefit of Taiwan application serial no. 109139461, filed on Nov. 12, 2020. The entirety of the above-mentioned patent application is hereby incorporated by reference herein and made a part of this specification.

BACKGROUND

Technical Field

The disclosure relates to a display and a repair method of the display, in particular, to a micro LED display and a repair method of the micro LED display.

Description of Related Art

With the development of display technologies, backlights in displays have evolved from LED backlights to mini LED backlights or micro LED backlights. Taking micro LED backlights for example, millions or tens of millions of micro LEDs are transferred from an epitaxial substrate to a display substrate through mass transfer. Some of the micro LEDs transferred onto the display substrate may be damaged or misaligned and unable to emit light and thus form a broken spot. As a result, the display quality may decline. Therefore, repair methods of such micro LED backlight have been proposed.

The display substrate may be divided into multiple pixel areas arranged in an array. According to a conventional repair method, a first soldering layer and a second soldering layer are provided in each of the pixel areas and formed in the circuit in each of the pixel areas. Specifically, during the transfer, the first soldering layer undergoes a first reflow process to bond each of the first micro LEDs to the circuit in each of the pixel areas through the first soldering layer. Meanwhile, the second soldering layer also undergoes the first reflow process. Once the first micro LED in any of the pixel areas is inspected as being damaged or misaligned, a repair procedure may be performed immediately. During the repair procedure, a second micro LED is transferred to the pixel area with a broken spot. The second soldering layer undergoes a second reflow process to bond the second micro LED to the circuit in the pixel area with a broken spot, thereby replacing the first micro LED that is unable to emit light.

Since the second soldering layer undergoes at least two reflow processes, it is concerned that the bonding strength between the circuit and the second micro LED in the pixel area with a broken spot may be insufficient, and the second soldering layer may be connected to other circuits in the same pixel area and cause a short circuit. To avoid a short circuit, a solder resist layer is commonly provided to prevent the soldering layer from overflowing, and the solder resist layer often covers the sides of the circuit layer. During the repair process, since a part of the space on the circuit layer is covered by the solder resist layer, a more precise alignment is required to connect the soldering layer and the circuit layer. In other words, further efforts are required on the repair yield of the repair method.

SUMMARY

An aspect of the disclosure provides a micro LED display which is reliable.

An aspect of the disclosure proposes a repair method of a micro LED display capable of increasing repair yield.

An aspect of the disclosure provides a micro LED display including a display substrate, a first soldering layer, at least one second soldering layer, a plurality of first micro LEDs and at least one second micro LED. The display substrate includes a substrate, a first circuit layer and a second circuit layer. A plurality of pixel areas are defined in the substrate, the first circuit layer and the second circuit layer are arranged in each of the pixel areas, and the second circuit layer in each of the pixel areas is arranged side by side with the first circuit layer. The first soldering layer is disposed on the first circuit layer. The first micro LEDs bonds to the first circuit layer in each of the pixel areas through the first soldering layer. The second soldering layer is disposed on the second micro LED. The second micro LED bonds to the second circuit layer of one of the pixel areas through the second soldering layer. In addition, an area in which the first soldering layer is arranged is greater than an area in which the second soldering layer is arranged.

In an embodiment of the disclosure, the first soldering layer completely covers a top surface of the first circuit layer, the top surface facing away from the substrate.

In an embodiment of the disclosure, the second soldering layer partially covers a top surface of the second circuit layer, the top surface facing away from the substrate.

In an embodiment of the disclosure, the area in which the second soldering layer is arranged is smaller than a surface area of a top surface of the second circuit layer, the top surface facing away from the substrate.

In an embodiment of the disclosure, the at least one second micro LED includes an epitaxial layer and an electrode connected to the epitaxial layer. The second soldering layer is formed on the electrode. The electrode and the second soldering layer are reflowed to form a gold layer, a gold indium alloy layer and an indium layer.

In an embodiment of the disclosure, the micro LED display further includes an optical clear adhesive layer disposed on the substrate. The optical clear adhesive layer covers a part of each of the first micro LEDs, a part of the second micro LED, the first soldering layer, the first circuit layer, the second soldering layer, and the second circuit layer.

In an embodiment of the disclosure, after the first micro LED and the second micro LED in the same pixel area are supplied with power, the second micro LED emit light and the first micro LED does not emit light.

In an embodiment of the disclosure, the first micro LED and a part of the first soldering layer corresponding to the first micro LED are removed and another part of the first soldering layer remains on the first circuit layer.

Another aspect of the disclosure provides a repair method of a micro LED display. The repair method includes the following. A display substrate is provided. The display substrate includes a substrate, a first circuit layer and a second circuit layer. The substrate includes a plurality of pixel areas. The first circuit layer and the second circuit layer are arranged in each of the pixel areas, and the second circuit layer in each of the pixel areas is arranged side by side with the first circuit layer. A first soldering layer is formed on the first circuit layer in each of the pixel areas. A plurality of first micro LEDs are transferred to the display substrate and the first micro LED bonds to the first circuit layer in each of the pixel areas through the first soldering layer. A second soldering layer is formed on at least one second micro LED. The second micro LED is transferred to the display substrate and bonds to the second circuit layer in one of the pixel areas through the second soldering layer. In addition, an area in which the first soldering layer is arranged is greater than an area in which the second soldering layer is arranged.

In an embodiment of the disclosure, the method further includes, after forming the first soldering layer on the first circuit layer in each of the pixel areas, forming an optical clear adhesive layer on the substrate. The optical clear adhesive covers the first soldering layer, the first circuit layer and the second circuit layer.

In an embodiment of the disclosure, during the transferring of the first micro LEDs to the display substrate, each of the first micro LEDs is embedded into the optical clear adhesive layer.

In embodiment of the disclosure, during the transferring of the at least one second micro LED to the display substrate, the at least one second micro LED and the second soldering layer are embedded into the optical clear adhesive layer.

In an embodiment of the disclosure, the repair method further includes inspecting the first micro LEDs before transferring the second micro LED to the display substrate.

Based on the above, the repair method of the micro LED display according to the embodiments of the disclosure is to form the second soldering layer in the second micro LED after any of the pixel areas is detected to have a broken spot. The repair procedure is then performed to transfer the second micro LED to the pixel area having a broken spot. In this way, the second soldering layer does not undergo the second reflow, and the bonding strength between the second micro LED and the pixel area having a broken spot can thus be reinforced. In addition, the area in which the second circuit layer is arranged is smaller than the surface area of the top surface, which faces away from the substrate, in the second circuit layer. Accordingly, a more tolerant space for precise alignment is provided. Without the coverage of a solder resist layer, the second soldering layer can still be prevented from connecting to the first circuit layer in the same pixel area. As a result, a short circuit can be avoided. Therefore, the repair method of the micro LED display according to the embodiments of the disclosure is capable of increasing the repair yield and the micro LED display so manufactured is reliable.

In order to make the above-mentioned features and advantages of the disclosure comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
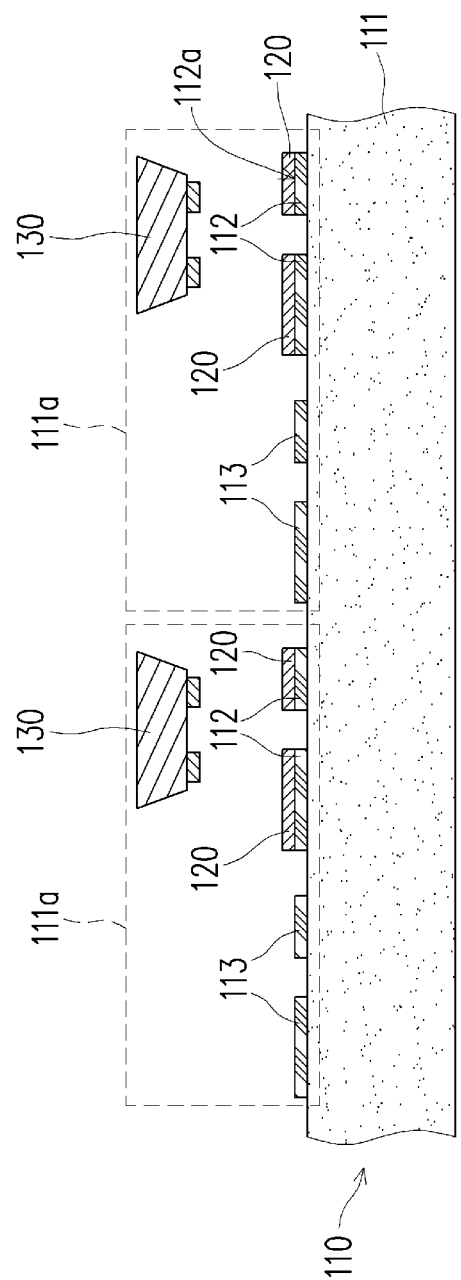
FIGS. 1A to 1D are schematic partial cross-sectional views of a repair method of a micro LED display according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic partial cross-sectional views of a repair method of a micro LED display according to an embodiment of the disclosure. First, referring to FIG. 1A and FIG. 1B, a transfer procedure is performed. As shown in FIG. 1A, a display substrate 110 is provided. The display substrate 110 includes a substrate 111, a first circuit layer 112 formed on the substrate 111 and a second circuit layer 113 formed on the substrate 111. In addition, the substrate 111 includes multiple pixel areas 111a. In addition, the first circuit layer 112 and the second circuit layer 113 are arranged in each of the pixel areas 111a, and the second circuit layer 113 in each of the pixel areas 111a is disposed arranged side by side with the first circuit layer 112.

For example, the materials of first circuit layer 112 and the second circuit layer 113 may include molybednum, titanium or ITO. The first circuit layer 112 serves as a main circuit in each of the pixel areas 111a and the second circuit layer 113 serves as a repair circuit in each of the pixel areas 111a.

Afterwards, a first soldering layer 120 is formed on the first circuit layer 112 in each of the pixel areas 111a by printing or coating, and the first soldering layer 120 completely covers a top surface 112a, which faces away from the substrate 111, of the first circuit layer 112. For example, the material of the first soldering layer 120 may include indium.

Figure 1B:
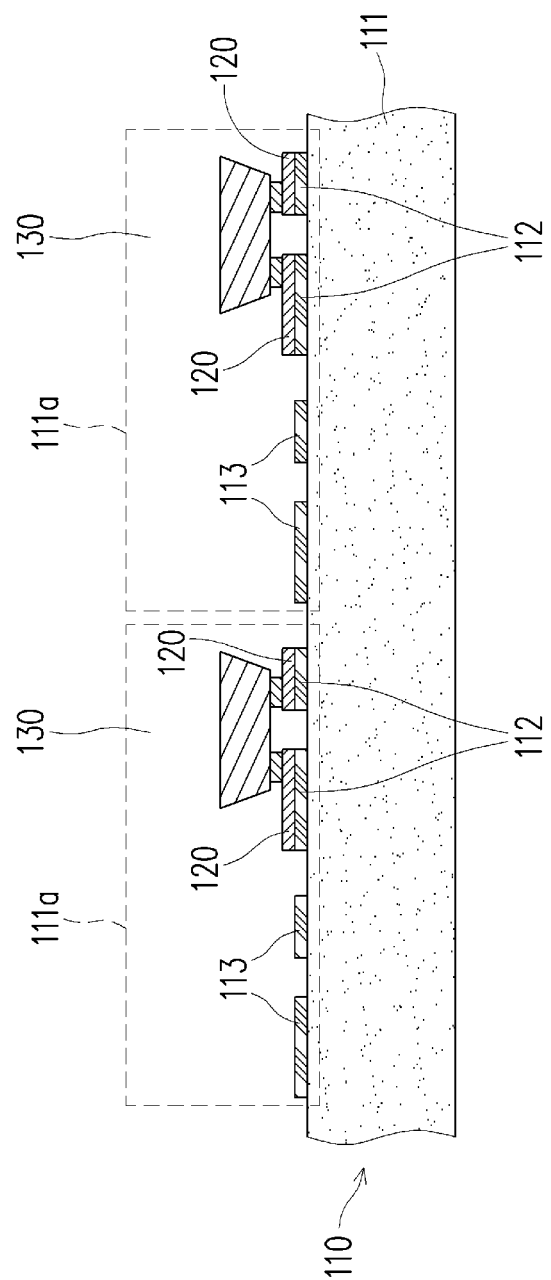

Then, referring to FIG. 1B, each of multiple first micro LEDs 130 is transferred to the display substrate 110 and bonded to the first circuit layer 112 in each of the pixel areas 111a through the first soldering layer 120. That is, each of the pixel areas 111a has one first micro LED 130. During the process of transferring the first micro LEDs 130 to the substrate 110, no solder is provided on the second circuit layer 113 in each of the pixel areas 111a.

Then, an inspection procedure is performed. During the inspection procedure, power is supplied to the first micro LEDs 130 and an automatic optical inspection (AOI) apparatus is adopted to inspect whether each of the pixel areas has a broken spot. If a broken spot is found in any of the pixel areas 111a, the first micro LED 130 in the pixel area 111a is damaged or misaligned and unable to emit light. After that, a repair procedure is performed on the pixel area 111a having a broken spot.

Figure 1C:
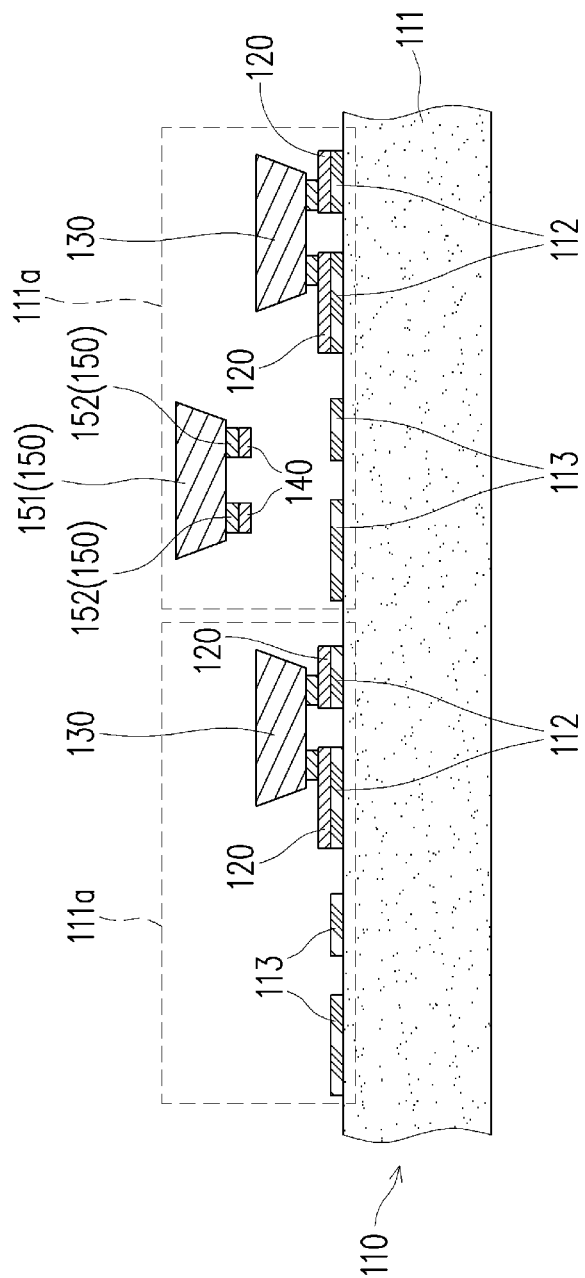

Then, as shown in FIG. 1C, at least one second micro LED 150 is provided. The color of light of the second micro LED 150 is the same as the color of light of the first micro LED 130 unable to emit light. After that, a second soldering layer 140 is formed on the at least one second micro LED 150. Specifically, the second micro LED 150 includes an epitaxial layer 151 and an electrode 152 connected to the epitaxial layer 151 and the second soldering layer 140 forms on the electrode 152. For example, the material of the second soldering layer 140 may include indium and the material of electrode 152 may include gold.

Figure 1D:
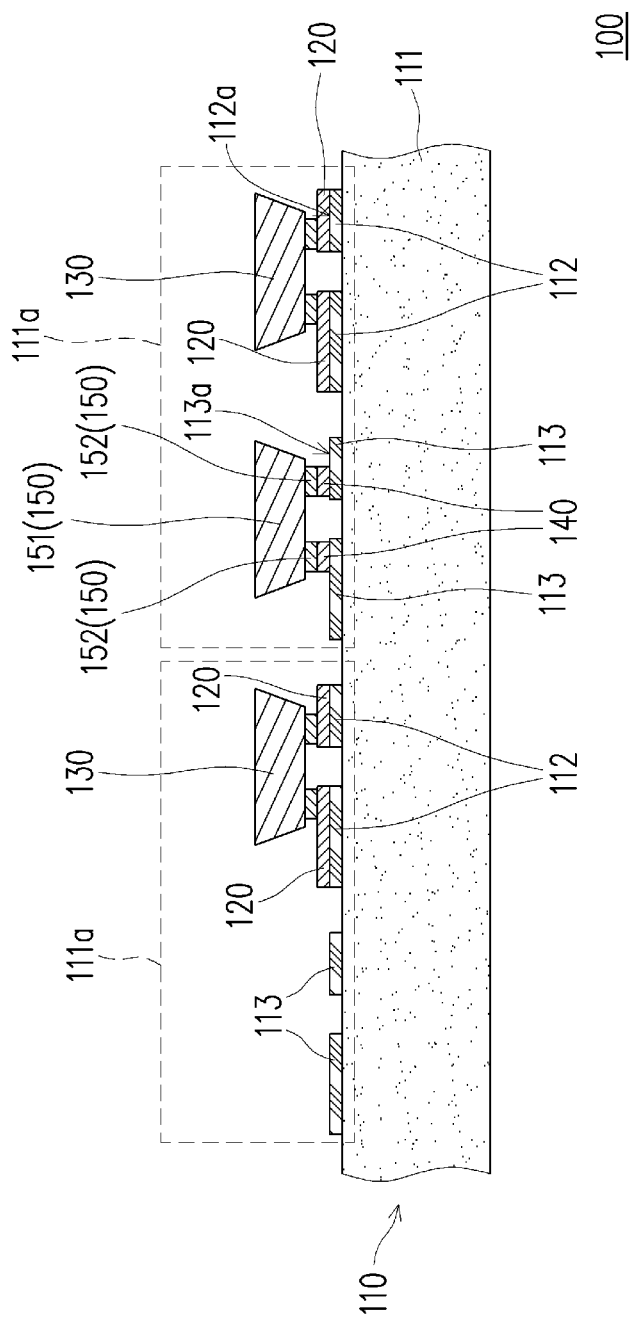

Finally, as shown in FIG. 1D, the second micro LED 150 is transferred to the display substrate 110 and bonded to the second circuit layer 113 in the pixel area 111a having a broken spot through the second soldering layer 140 to replace the first micro LED 130 unable to emit light. Therefore, when power is supplied the first micro LED 130 and the second micro LED 150 in the pixel area 111a having a broken spot, the second micro LED 150 emits light and the first micro LED 130 does not emit light. In addition, in the pixel area not having a broken spot, the second soldering layer 140 is not provided on the second circuit layer 113.

In the embodiment, the geometric outlines or the sizes of the first circuit layer 112 and the second circuit layer 113 in each of the pixel areas 111a are the same. The first soldering layer 120 completely covers the top surface 112a, which faces away from the substrate 111, of the first circuit layer 112 and the second soldering layer 140 partially covers a top surface 113a, which faces away from the substrate 111, of the second soldering layer 140. Therefore, the area where the first soldering layer 120 is arranged on the first circuit layer 112 is greater than the area where the second soldering layer 140 is arranged on the second circuit layer 113. In other words, the area where the second soldering layer 140 is arranged is smaller than the surface area of the top surface 113a, which faces away from the substrate 111, of the second circuit layer 113.

During the process of transferring the first micro LEDs 130 to the display substrate 110, the second circuit layer 113 in each of the pixel areas 111a is not provided with the second soldering layer 140. In other words, during the repair procedure, the second soldering layer 140 formed on the second micro LED 150 does not require a second reflow. Therefore, the second micro LED 150 may be bonded firmly to the second circuit layer 113 in the pixel area 111a having a broken spot through the second soldering layer 140.

The repair method not only increases the bonding strength between the second micro LED 150 and the second circuit layer 113 in the pixel area 111a having a broken spot, but provides a more tolerant space for precise alignment because the area in which the second soldering layer 140 is arranged is smaller than the surface area of the top surface 113a, which faces away from the substrate 111, of the second circuit layer 113. In other words, without the coverage of a solder resist layer, the second soldering layer 140 can be prevented from connecting to the first circuit layer 112 in the same pixel area 111a to form a short circuit. Therefore, the repair method helps increase the repair yield, and the micro LED display 100 so manufactured is reliable.

Figure 1E:
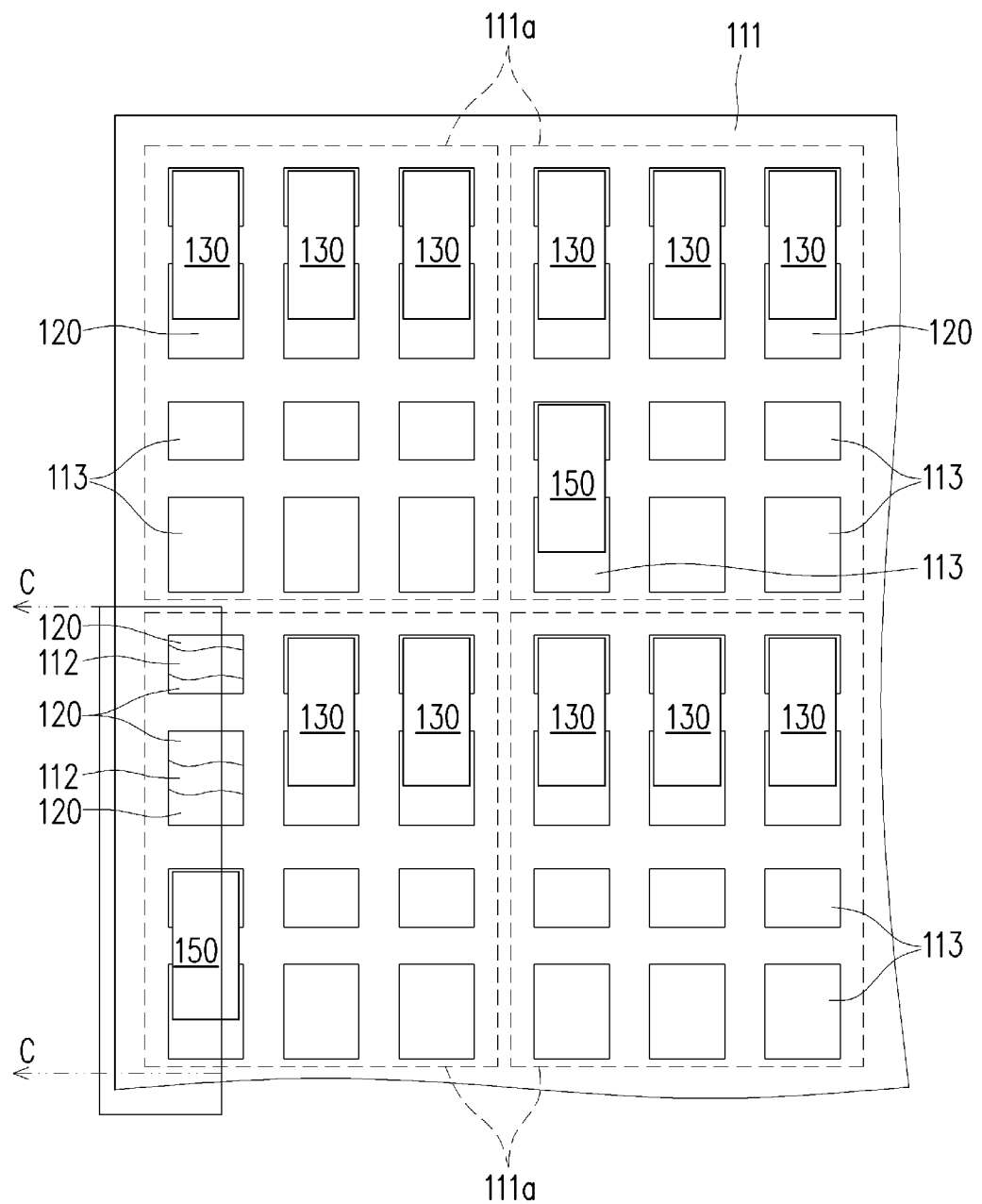
FIG. 1E is a schematic partial top-view of a micro LED display according to an embodiment of the disclosure.
Figure 1F:
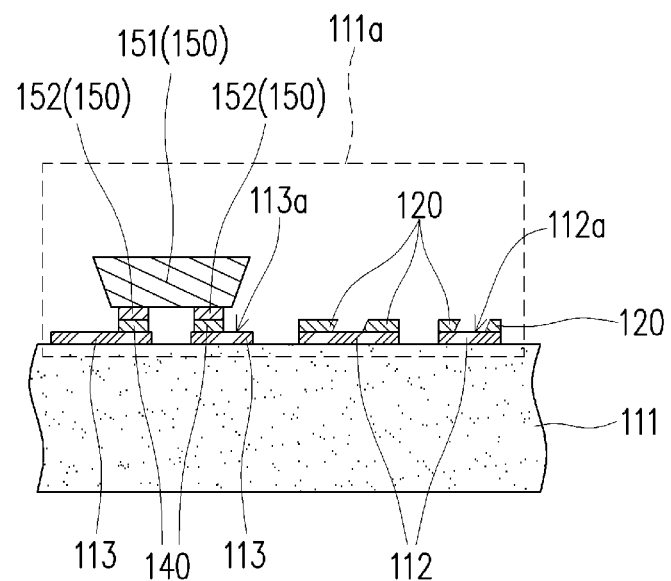
FIG. 1F is a schematic partial cross-sectional view of a micro LED display taken along the section line C-C of FIG. 1E.

FIG. 1E is a schematic partial top-view of a micro LED display according to an embodiment of the disclosure. FIG. 1F is a schematic partial cross-sectional view of a micro LED display taken along the section line C-C of FIG. 1E. Referring to FIG. 1E and FIG. 1F, in an embodiment, in the pixel area 111a having a broken spot (i.e., the pixel area on the lower left corner of FIG. 1E), the first micro LED 130 unable to emit light normally (e.g., a short circuit or an open circuit is formed when the first micro LED 130 is bonded to the first circuit layer 112 may be removed by laser. During the process of removing the first micro LED 130, a part of the first soldering layer 120 is removed along with the first micro LED 130, and another part of the first soldering layer 120 remains on the first circuit layer 112. For example, after the part of the first soldering layer 120 is removed along with the first micro LED 130, a part of the top surface 112a of the first circuit layer 112 is exposed. In addition, in another pixel area 111a having a broken spot (i.e., the pixel area on the upper right corner of FIG. 1E), the first micro LED 130 and the second micro LED 150 are both present. In other words, the first micro LED 130 unable to emit light, (e.g., the first micro LED 130 unable emit light because an open circuit is formed when the first micro LED 130 is bonded to the first circuit layer 112) is not removed.

Figure 2:
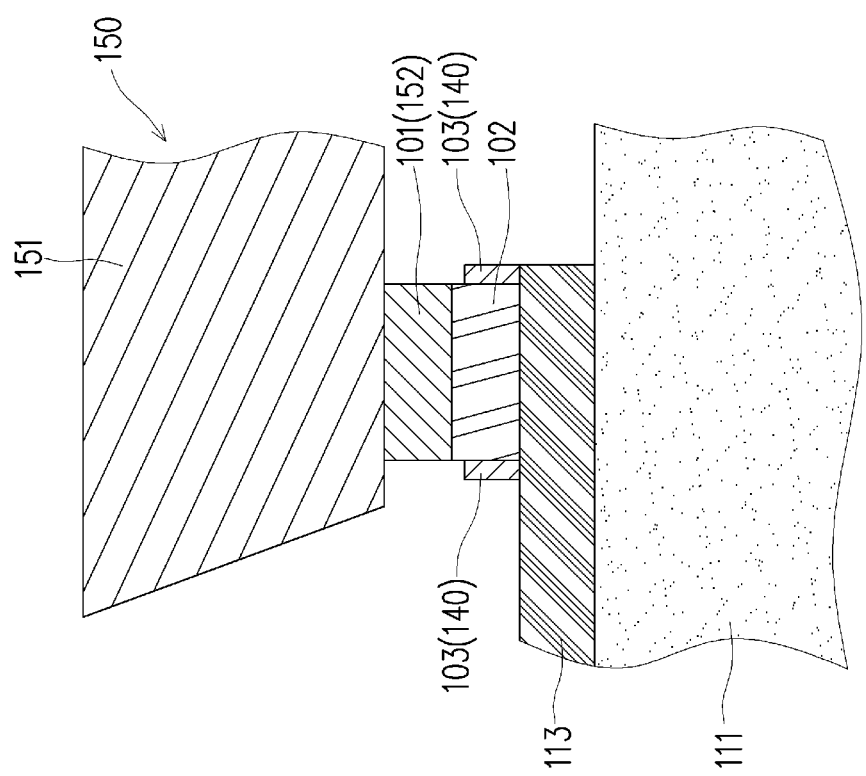
FIG. 2 is a schematic partially enlarged view of a second micro LED bonding to a second circuit layer according to an embodiment of the disclosure.

FIG. 2. is a schematic partially enlarged view of a second micro LED bonding to a second circuit layer according to an embodiment of the disclosure. Referring to FIG. 2, the material of the second soldering layer 140 may include indium and the material of the electrode 152 of the second micro LED 150 may include gold. After a reflow process, the electrode 152 and the second soldering layer 140 are reflowed to form a gold layer 101, a gold indium alloy layer 102 and an indium layer 103. The gold layer 101 is a part of the electrode 152 which does not undergo a chemical reaction and the indium layer 103 is a part of the second soldering layer 140 which does not undergo a chemical reaction, whereas the gold indium alloy layer 102 is another part of the electrode 152 that undergoes a chemical reaction and another part of the second soldering layer 140 that undergoes a chemical reaction. Specifically, the gold layer 101 located on the gold indium alloy layer 102 and connected to the epitaxial layer 151. The gold indium alloy layer 102 and the indium layer 103 are connected to the second circuit layer 113. The gold indium alloy layer 102 is located between the gold layer 101 and the second circuit layer 113 and the indium layer 103 partially covers the outer wall surface of the gold indium alloy layer 102.

Figure 3:
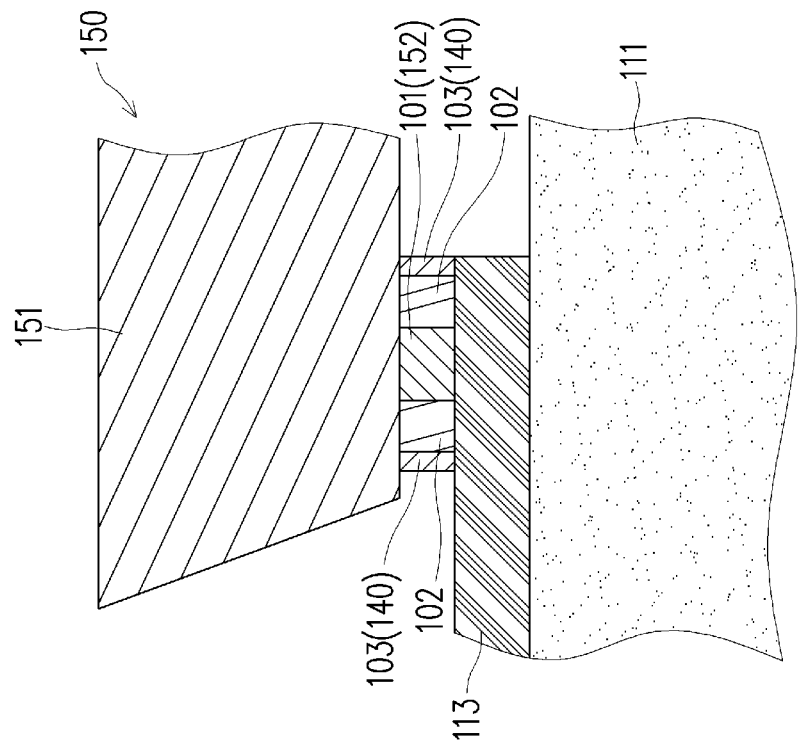
FIG. 3 is a schematic partially enlarged view of a second micro LED bonding to a second circuit layer according to another embodiment of the disclosure.

FIG. 3 is a schematic partially enlarged view of a second micro LED bonding to a second circuit layer according to another embodiment of the disclosure. Referring to FIG. 3, the material of the second soldering layer 140 may include indium and the material of the electrode 152 of the second micro LED 150 may include gold. After a reflow process, the electrode 152 and the second soldering layer 140 are reflowed to form the gold layer 101, the gold indium alloy layer 102 and the indium layer 103. The Gold layer 101 is a part of the electrode 152 that does not undergo a chemical reaction and the indium layer 103 is a part of the second soldering layer that does not a undergo chemical reaction. In addition, the gold indium alloy layer 102 is another part of the electrode 152 that undergoes chemical reaction and is also another part of the second soldering layer 140 that undergoes chemical reaction. Specially, the gold layer 101, the gold indium alloy layer 102 and the indium layer 103 are all connected to the epitaxial layer 151 and the second circuit layer 113. The Gold layer 101 is covered by the gold indium alloy layer 102 and the gold indium alloy layer 102 is covered by the indium layer 103. The order from the inside to the outside is the gold layer 101, the gold indium alloy layer 102 and, the indium layer 103.

FIGS. 4A to 4D are schematic partial cross-sectional views showing a repair of a micro LED display according to another embodiment of the disclosure. Referring to FIGS. 4A to 4D, a repair method of a micro LED display 100A of the embodiment is substantially same as the repair method of the micro LED display 100 in the above embodiment. The main difference is that, in the embodiment, after the first soldering layer 120 is formed in the first circuit layer 112 in each of the pixel areas 111a, an optical clear adhesive layer 160 is formed on the substrate 111 and then the first micro LEDs 130 are transferred.

Specially, the optical clear adhesive layer 160 may be an optical clear adhesive or optical resin and the optical clear adhesive layer 160 covers the first soldering layer 120, the first circuit layer 112 and the second circuit layer 113. During the process of transferring the first micro LEDs 130 to the display substrate 110, each of the first micro LEDs 130 is embedded into the optical clear adhesive layer 160 and the optical clear adhesive layer 160 covers a part of a side wall surface of each of the first micro LEDs 130 and a bottom surface of each of the first micro LED 130, the bottom surface facing the substrate 111.

Figure 4A:
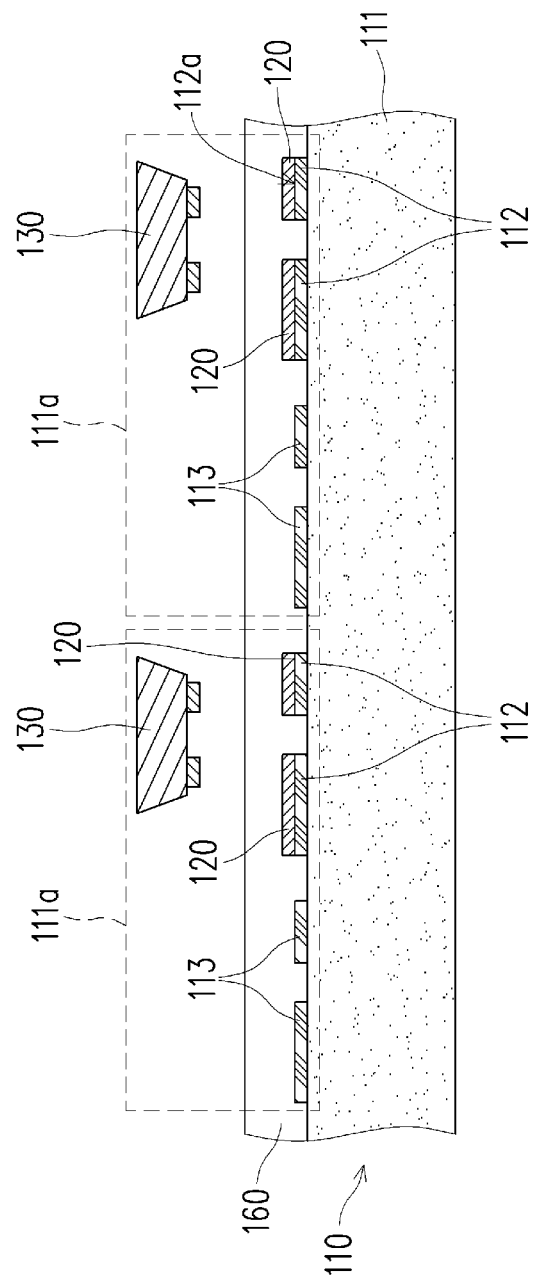
FIGS. 4A to 4D are schematic partial cross-sectional views of a repair method of a micro LED display according to another embodiment of the disclosure.
Figure 4B:
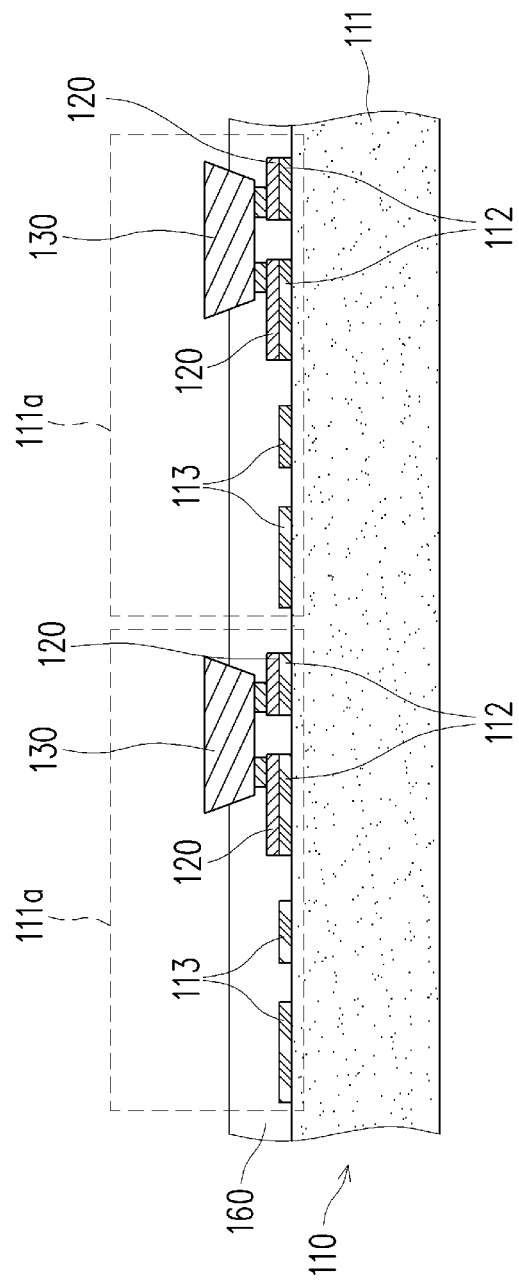
Figure 4C:
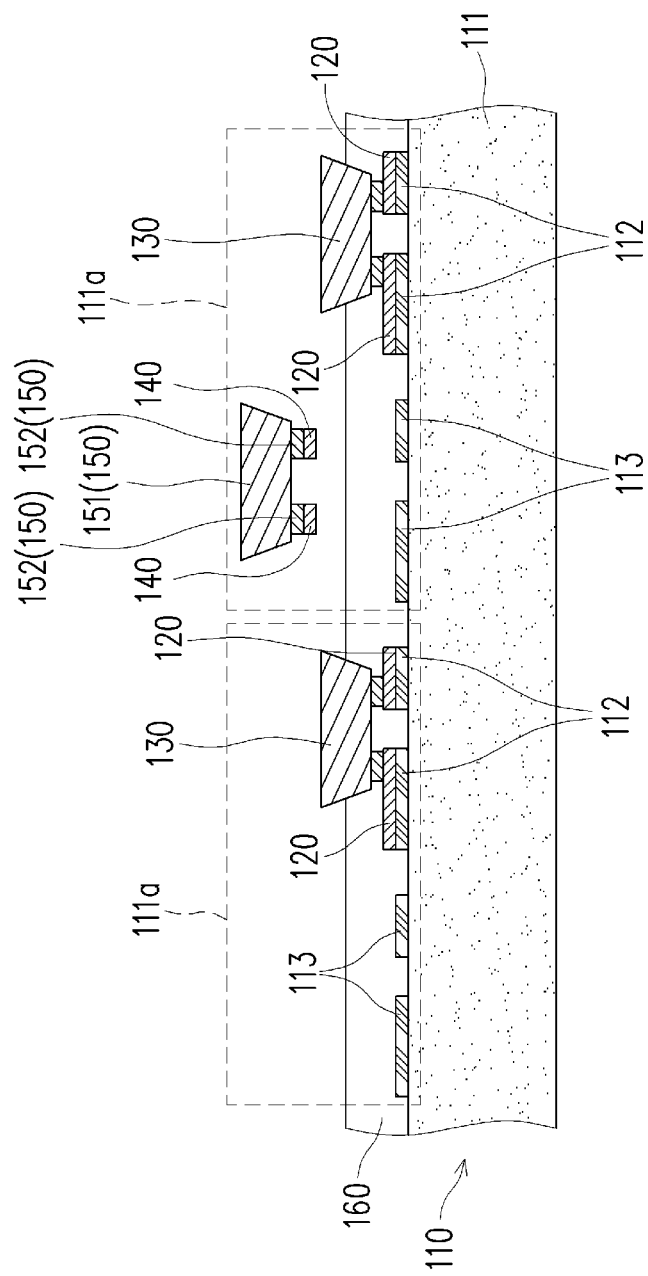
Figure 4D:
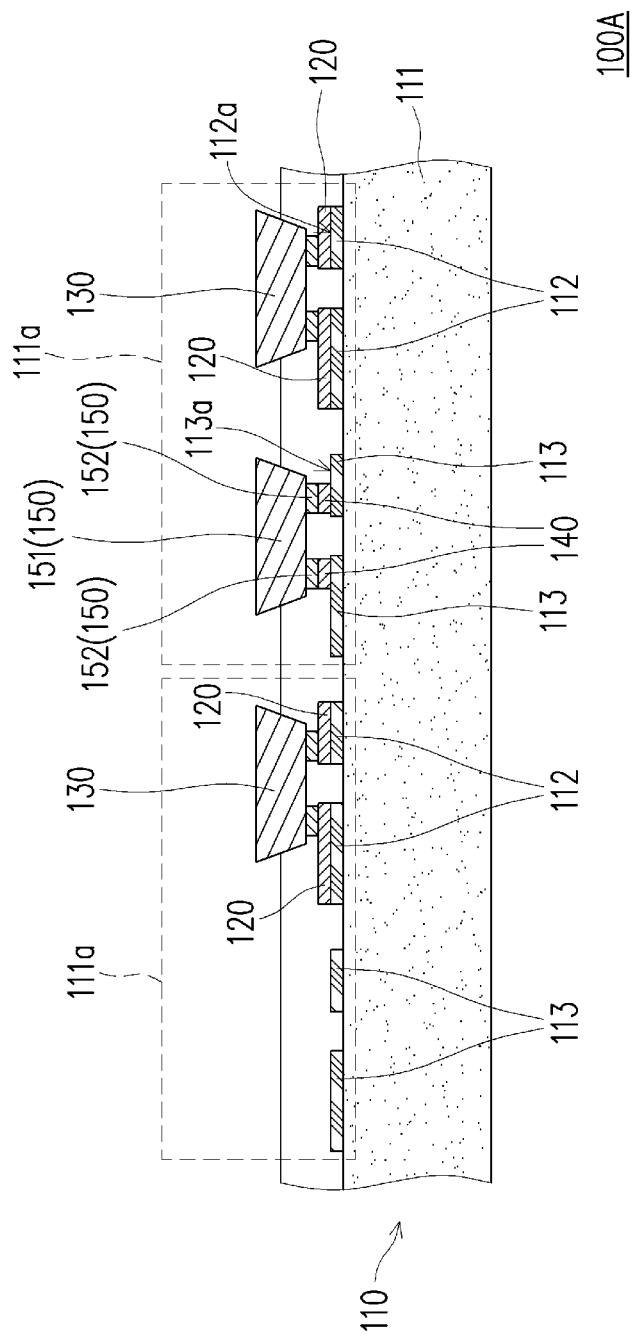

As shown in FIG. 4C and FIG. 4D, during the process of transferring the second micro LED 150 to the display substrate 110, the second micro LED 150 is embedded into the optical clear adhesive layer 160 and the optical clear adhesive layer 160 covers a part of a side wall surface of the second micro LED 150 and the bottom surface of each of the first micro LED 150, the bottom surface facing the substrate 111. Specifically, the optical clear adhesive layer 160 covers the second soldering layer 140 and the electrode 152 in the second micro LED 150.

Finally, the optical clear adhesive layer 160 is cured to fix the positions of the first micro LEDs 130 on the substrate 111 and fix the position of the second micro LED 150 on the substrate 111 to avoid misalignment.

Before the transfer of the first micro LEDs 130, the optical clear adhesive layer 160 is formed on the substrate 111. Before being cured, the optical clear adhesive layer 160 may serve as a buffer helping avoid misalignment or a short circuit in the first micro LEDs 130 during the transfer. Similarly, the optical clear adhesive layer 160 may also help avoid misalignment or a short circuit in the second micro LED 150 during the transfer.

In view of the foregoing, the repair method of the micro LED display according to the embodiments of the disclosure is to form the second soldering layer in the second micro LED after any of the pixel areas is detected to have a broken spot. The repair procedure is then performed to transfer the second micro LED to the pixel area having a broken spot. In this way, the second soldering layer does not undergo the second reflow, and the bonding strength between the second micro LED and the pixel area having a broken spot can thus be reinforced. In addition, the area in which the second circuit layer is arranged is smaller than the surface area of the top surface, which faces away from the substrate, in the second circuit layer. Accordingly, a more tolerant space for precise alignment is provided. Without the coverage of a solder resist layer, the second soldering layer can still be prevented from connecting to the first circuit layer in the same pixel area. As a result, a short circuit can be avoided. Therefore, the repair method of the micro LED display according to the embodiments of the disclosure is capable of increasing the repair yield and the micro LED display so manufactured is reliable. In some embodiments, the optical clear adhesive layer is formed on the display substrate before the transferring procedure or the repair procedure to avoid misalignment or a short circuit of the first micro LED or the second micro LED during the transfer.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A micro LED display, comprising:
    a display substrate, comprising a substrate, a first circuit layer and a second circuit layer, wherein a plurality of pixel areas are defined in the substrate, the first circuit layer and the second circuit layer are arranged in each of the pixel areas, and the second circuit layer in each of the pixel areas is arranged side by side with the first circuit layer;
    a first soldering layer, disposed on the first circuit layer;
    a plurality of first micro LEDs, each bonding to the first circuit layer in each of the pixel areas through the first soldering layer;
    at least one second micro LED; and
    at least one second soldering layer, disposed on the second micro LED, wherein the second micro LED bonds to the second circuit layer of one of the pixel areas through the second soldering layer,
    wherein an area in which the first soldering layer is arranged is greater than an area in which the second soldering layer is arranged,
    wherein the first soldering layer and the second soldering layer are respectively disposed on the first circuit layer and the second circuit layer arranged in each of the pixel areas and not overlapped with each other, and after the first micro LED and the second micro LED in the same pixel area are supplied with power, the second micro LED bonded to the second circuit layer of one of the pixel areas through the second soldering layer emits light, and the first micro LED bonded to the first circuit layer in each of the pixel areas through the first soldering layer does not emit light.

2. The micro LED display according to claim 1, wherein the first soldering layer completely covers a top surface of the first circuit layer, the top surface facing away from the substrate.

3. The micro LED display according to claim 1, wherein the second soldering layer partially covers a top surface of the second circuit layer, the top surface facing away from the substrate.

4. The micro LED display according to claim 1, wherein the area in which the second soldering layer is arranged is smaller than a surface area of a top surface of the second circuit layer, the top surface facing away from the substrate.

5. The micro LED display according to claim 1, wherein the at least one second micro LED comprises an epitaxial layer and an electrode connected to the epitaxial layer, the second soldering layer is formed on the electrode, and the electrode and the second soldering layer are reflowed to form a gold layer, a gold indium alloy layer and an indium layer.

6. The micro LED display according to claim 1, further comprising an optical clear adhesive layer disposed on the substrate, wherein the optical clear adhesive layer covers a part of each of the first micro LEDs, a part of the at least one second micro LED, the first soldering layer, the first circuit layer, the second soldering layer, and the second circuit layer.

7. The micro LED display according to claim 1, wherein the first micro LED and a part of the first soldering layer corresponding to the first micro LED are removed and another part of the first soldering layer remains on the first circuit layer.

8. A repair method of a micro LED display, the repair method comprising:
    providing a display substrate, wherein the display substrate comprises a substrate, a first circuit layer and a second circuit layer, the substrate comprises a plurality of pixel areas, the first circuit layer and the second circuit layer are arranged in each of the pixel areas, and the second circuit layer in each of the pixel areas is arranged side by side with the first circuit layer;
    forming a first soldering layer on the first circuit layer in each of the pixel areas;

transferring a plurality of first micro LEDs to the display substrate and bonding the first micro LED to the first circuit layer in each of the pixel areas through the first soldering layer;

forming a second soldering layer on at least one second micro LED; and transferring the at least one second micro LED to the display substrate and bonding the second micro LED to the second circuit layer in one of the pixel areas through the second soldering layer, wherein an area in which the first soldering layer is arranged is greater than an area in which the second soldering layer is arranged, wherein the first soldering layer and the second soldering layer are respectively disposed on the first circuit layer and the second circuit layer arranged in each of the pixel areas and not overlapped with each other, and after the first micro LED and the second micro LED in the same pixel area are supplied with power, the second micro LED bonded to the second circuit layer of one of the pixel areas through the second soldering layer emits light, and the first micro LED bonded to the first circuit layer in each of the pixel areas through the first soldering layer does not emit light.

9. The repair method according to claim 8, wherein the first soldering layer completely covers a top surface of the first circuit layer, the top surface facing away from the substrate.

10. The repair method according to claim 8, wherein the second soldering layer partially covers a top surface of the second circuit layer, the top surface facing away from the substrate.

11. The repair method according to claim 8, wherein an area in which the second soldering layer is arranged is smaller than a surface area of a top surface of the second circuit layer, the top surface facing away from the substrate.

12. The repair method according to claim 8, wherein the at least one second micro LED comprises an epitaxial layer and an electrode connected to the epitaxial layer, the second soldering layer is formed on the electrode, and the electrode and the second soldering layer are reflowed to form a gold layer, a gold indium alloy layer and an indium layer.

13. The repair method according to claim 8, further comprising:

after forming the first soldering layer on the first circuit layer in each of the pixel areas, forming an optical clear adhesive layer on the substrate, wherein the optical clear adhesive covers the first soldering layer, the first circuit layer and the second circuit layer.

14. The repair method according to claim 13, wherein during the transferring of the first micro LEDs to the display substrate, each of the first micro LEDs is embedded into the optical clear adhesive layer.

15. The repair method according to claim 13, wherein during the transferring of the at least one second micro LED to the display substrate, the at least one second micro LED and the second soldering layer are embedded into the optical clear adhesive layer.

16. The repair method according to claim 8, further comprising:

inspecting the first micro LEDs before transferring the at least one second micro LED to the display substrate.

* * * * *